(12) United States Patent
Siniaguine

(10) Patent No.: US 7,173,327 B2
(45) Date of Patent: Feb. 6, 2007

(54) CLOCK DISTRIBUTION NETWORKS AND CONDUCTIVE LINES IN SEMICONDUCTOR INTEGRATED CIRCUITS

(75) Inventor: Oleg Siniaguine, San Carlos, CA (US)

(73) Assignee: Tru-Si Technologies, Inc., Sunnyvale, CA (US)

( * ) Notice: Subject to any disclaimer, the term of this patent is extended or adjusted under 35 U.S.C. 154(b) by 0 days.

(21) Appl. No.: 11/131,711

(22) Filed: May 18, 2005

(65) Prior Publication Data

US 2005/0207238 A1   Sep. 22, 2005

Related U.S. Application Data

(62) Division of application No. 10/956,827, filed on Oct. 1, 2004, which is a division of application No. 10/375,208, filed on Feb. 17, 2003, which is a division of application No. 10/127,144, filed on Apr. 18, 2002, now Pat. No. 6,730,540.

(51) Int. Cl.
*H01L 27/10* (2006.01)

(52) U.S. Cl. .................. 257/691; 257/698; 257/737

(58) Field of Classification Search ...................... None
See application file for complete search history.

(56) References Cited

U.S. PATENT DOCUMENTS

| | | | |
|---|---|---|---|
| 5,001,525 A | | 3/1991 | Kenney |
| 5,057,895 A | | 10/1991 | Beasom |
| 5,119,155 A | * | 6/1992 | Hieda et al. ................. 257/304 |

(Continued)

FOREIGN PATENT DOCUMENTS

EP   254 046   1/1988

(Continued)

OTHER PUBLICATIONS

E.A.M. Klumpernik et al., "Transmission Lines in CMOS: An Explorative Study", 12 th Annual Workshop on Circuits, Systems and Signal Processing, Veldhove/Netherlands, Nov. 29-30, 2001, pp. 440-445.

(Continued)

*Primary Examiner*—Nathan J. Flynn
*Assistant Examiner*—Ahmed W. Sefer
(74) *Attorney, Agent, or Firm*—Michael Shenker; MacPherson Kwok Chen & Heid LLP

(57) ABSTRACT

A clock distribution network (110) is formed on a semiconductor interposer (320) which is a semiconductor integrated circuit. An input terminal (120) of the clock distribution network is formed on one side of the interposer, and output terminals (130) of the clock distribution network are formed on the opposite side of the interposer. The interposer has a through hole (360), and the clock distribution network includes a conductive feature going through the through hole. The side of the interposer which has the output terminals (130) is bonded to a second integrated circuit (310) containing circuitry clocked by the clock distribution network. The other side of the interposer is bonded to a third integrated circuit or a wiring substrate (330). The interposer contains a ground structure, or ground structures (390, 510), that shield circuitry from the clock distribution network. Conductive lines (150) in an integrated circuit are formed in trenches (610) in a semiconductor substrate.

17 Claims, 15 Drawing Sheets

U.S. PATENT DOCUMENTS

| | | |
|---|---|---|
| 5,177,594 A | 1/1993 | Chance et al. |
| 5,251,097 A | 10/1993 | Simmons et al. |
| 5,416,861 A | 5/1995 | Koh et al. |
| 5,466,963 A | 11/1995 | Beasom |
| 5,501,006 A | 3/1996 | Gehman, Jr. et al. |
| 5,665,989 A | 9/1997 | Dangelo |
| 5,761,350 A | 6/1998 | Koh |
| 5,811,868 A | 9/1998 | Bertin et al. |
| 5,933,717 A | 8/1999 | Hause et al. |
| 6,037,822 A * | 3/2000 | Rao et al. .................. 327/298 |
| 6,040,203 A | 3/2000 | Bozso et al. |
| 6,175,160 B1 | 1/2001 | Paniccia et al. |
| 6,222,246 B1 | 4/2001 | Mak et al. |
| 6,236,079 B1 | 5/2001 | Nitayama et al. |
| 6,265,321 B1 | 7/2001 | Chooi et al. |
| 6,271,795 B1 | 8/2001 | Lesea et al. |
| 6,281,042 B1 | 8/2001 | Ahn et al. |
| 6,281,547 B1 | 8/2001 | So et al. |
| 6,311,313 B1 | 10/2001 | Camporese et al. |
| 6,322,903 B1 | 11/2001 | Siniaguine et al. |
| 6,424,034 B1 | 7/2002 | Ahn et al. |
| 6,461,895 B1 | 10/2002 | Liang et al. |
| 6,495,442 B1 | 12/2002 | Lin et al. |
| 6,586,835 B1 | 7/2003 | Ahn et al. |
| 2001/0006233 A1 | 7/2001 | Vallett |
| 2001/0040664 A1 * | 11/2001 | Tajima et al. ............... 349/150 |
| 2002/0068441 A1 | 6/2002 | Lin |
| 2004/0166659 A1 | 8/2004 | Lin et al. |
| 2004/0173880 A1 * | 9/2004 | Achyut ...................... 257/664 |

FOREIGN PATENT DOCUMENTS

| | | | |
|---|---|---|---|
| EP | 280 848 | | 8/1988 |
| JP | 2000-58545 | * | 2/2000 |

OTHER PUBLICATIONS

Jim Lipman, Technical Editor, "Growing your own IC clock tree", EDN Access—03.14.97 Growing your own IC clock tree, Jim Lipman, Technical Editor, "Growing your own IC clock tree", EDN Access—03.14.97 Growing your own IC clock tree, http://archives.e-insite.net/archives/ednmag/reg/1997/031497/06CS.HTM, Feb. 27, 2002, pp. 1-7.

L. Cao and J.P. Krusius, A Novel "Double-Decker" Flip-Chip BGA Package for Lower Power Giga-Hertz Clock Distribution, 1997 47th Electronic Components and Technology Conference, San Jose, CA, 1152-1157 (May 16-21, 1997).

* cited by examiner

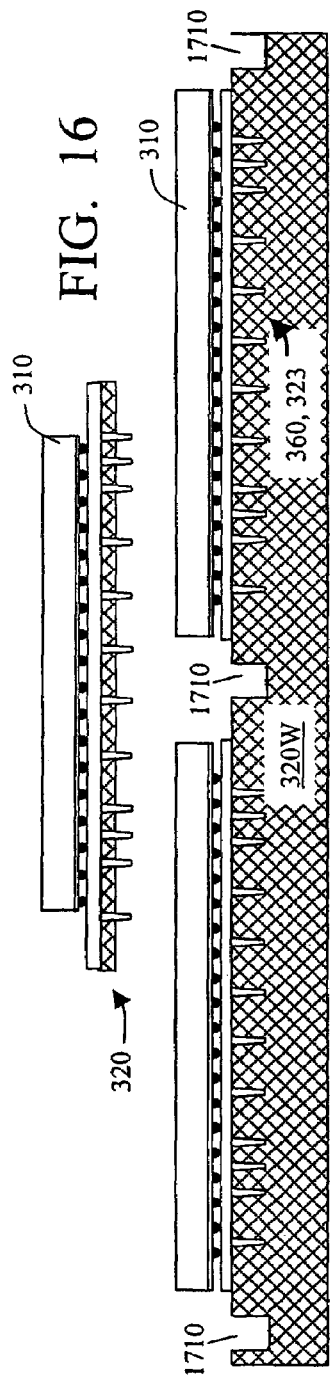
FIG. 16
FIG. 17A
FIG. 17B
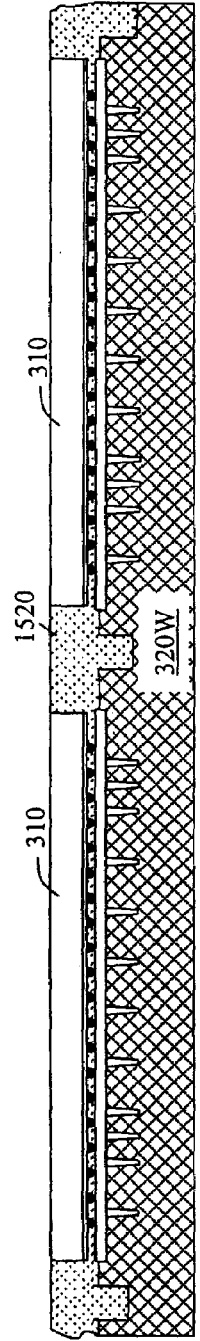
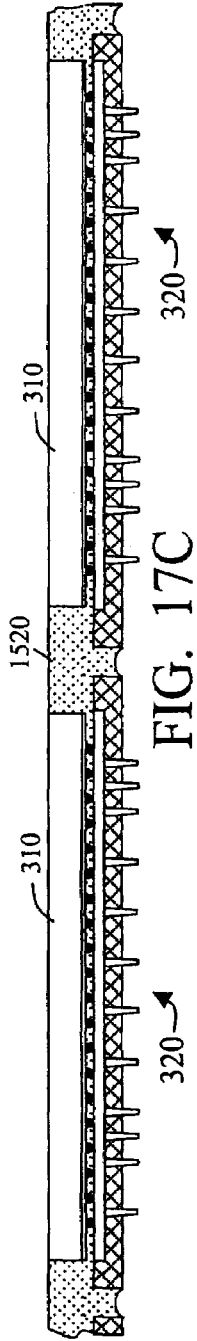
FIG. 17C
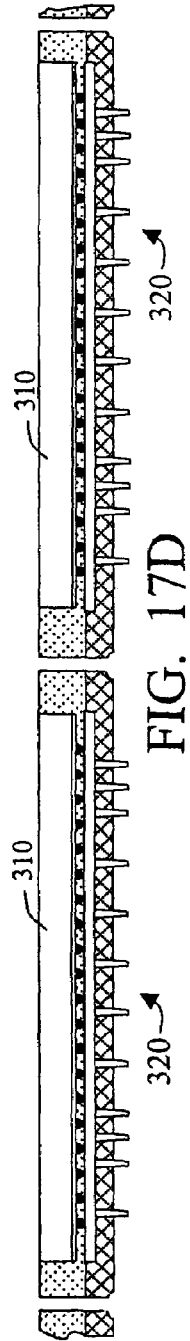
FIG. 17D

CLOCK DISTRIBUTION NETWORKS AND CONDUCTIVE LINES IN SEMICONDUCTOR INTEGRATED CIRCUITS

CROSS REFERENCE TO RELATED APPLICATIONS

The present application is a division of U.S. patent application Ser. No. 10/956,827, filed Oct. 1, 2004, incorporated herein by reference, which is a division of U.S. patent application Ser. No. 10/375,208, filed Feb. 17, 2003, incorporated herein by reference, which is a division of U.S. patent application Ser. No. 10/127,144, filed Apr. 18, 2002, now U.S. Pat. No. 6,730,540, incorporated herein by reference.

BACKGROUND OF THE INVENTION

The present invention relates to placement of clock distribution networks and fabrication of conductive lines in semiconductor integrated circuit structures.

FIG. 1 shows a tree-like clock distribution network 110 designed to distribute a clock signal with a minimum clock skew in an integrated circuit. The clock signal is received at a terminal 120 and distributed to terminals 130 at the leaves of tree 110. Terminals 130 are connected to inputs of circuit blocks 140 such as registers, flip flops, latches, logic gates, etc. The network tree is provided by conductive lines 150. The wires 150 that connect the tree nodes of each given tree level to the tree nodes of any given adjacent level have the same dimensions. Buffers (amplifiers) 160 are located at selected points in the tree to amplify the clock signal. In order to minimize the clock skew, each clock path from terminal 120 to a terminal 130 has the same dimensions, and the respective buffers 160 in each path are identical to each other. These rules are sometimes violated to compensate for different loading at different terminals 130. For example, the lengths or widths of individual wires 150 can be adjusted.

FIG. 2 is a plan view of a grid type clock distribution network. Lines 150 form a grid, with the horizontal and vertical lines being connected together at the points of intersection. The clock signal is delivered to terminal 120 at the grid center, amplified by buffer 160.1, and distributed to buffers 160.2 at the grid edges. Each buffer 160.2 drives a horizontal or vertical line 150. Clock terminals 130 are positioned on lines 150 and connected to circuit blocks such as blocks 140 of FIG. 1.

Other clock distribution networks are also known. For example, the tree and grid networks can be combined. A circuit block 140 of FIG. 1 can be replaced with a grid network or a local clock generation circuit. See U.S. Pat. No. 6,311,313 entitled "X-Y GRID TREE CLOCK DISTRIBUTION NETWORK WITH TUNABLE TREE AND GRID NETWORKS" issued Oct. 30, 2001 to Camporese et al., incorporated herein by reference.

A perfect placement of a clock distribution network on a semiconductor die can be difficult due to the presence of other circuitry. A modern integrated circuit may include up to eight metal layers. The clock distribution network uses one of these layers for lines 150. Another metal layer, underlying the lines 150, is used for a ground plane or a ground grid to shield the underlying circuitry from the electromagnetic field generated by high frequency clock signals on lines 150. These two layers are separated by a dielectric. The speed of signal propagation along the clock distribution network is affected by the capacitance between the lines 150 and the ground plane or grid. The capacitance is not uniform across the integrated circuit due to local variations of the dielectric thickness and the capacitive coupling between the lines 150 and other nearby switching lines. As a result, it is difficult to control the impedance of lines 150 and therefore the clock propagation speed.

Further, the ground plane or grid consumes valuable area, increases the cost and complexity of the integrated circuit, and sometimes does not completely eliminate the electromagnetic interference problem because the position of the ground plane or grid can be restricted to allow the same metal layer to be used for other circuit elements.

In FIG. 3, the clock distribution network is removed from die 310 containing the clocked circuitry, and placed on a separate ("secondary") die 320. The dies 310 and 320 are bonded together in a flip chip manner with solder balls 321. The two dies are offset from each other so that each die has contact pads not covered by the other die. These contact pads are shown as pads 322 on die 310 and pads 323 on die 320. Pads 322, 323 are connected to external circuitry (not shown) with solder balls 313. Alternatively, die 320 can be made larger than die 310 to make room for contact pads 323. See U.S. Pat. No. 6,040,203 entitled "CLOCK SKEW MINIMIZATION AND METHOD FOR INTEGRATED CIRCUITS", issued Mar. 21, 2000 to Bozso et al., incorporated herein by reference.

SUMMARY

The invention is defined by the appended claims which are incorporated into this section by reference. Some features of the invention are summarized immediately below.

The inventor has observed that in the structure of FIG. 3 significant electromagnetic interference, as well as parasitic capacitance, can be associated with the transfer of signals and power and ground voltages between contact pads 322, 323 and circuit blocks in dies 310 and 320. The signal, power, and ground paths between contact pads 322 and blocks 140 go through conductive lines 324. The signal, power and ground paths between contact pads 323 and circuit 310, and the paths between contact pads 323 and circuitry 325 in die 320, go through conductive lines 326. Depending on the layout, the lines 324, 326 can be parallel to lines 150, or make small angles with lines 150. The small angles when combined with small spacing between a line 324 or 326 and a line 150 may lead to significant electromagnetic interference and parasitic capacitance.

In some embodiments of the invention, some or all of the contact pads 323, and at least a contact pad that serves as the input terminal of the clock distribution network, are moved to the bottom of die 320. The bottom contact pads 323 are connected to circuitry at the top of the die by means of conductive features forming large angles (e.g. 90°) with the top and bottom surfaces of die 310. Since large portions of lines 150 extend along the top surface of die 310, the electromagnetic interference and the parasitic capacitance can be reduced.

In some embodiments, contact pads 322 are omitted. The conductive paths to and from die 310 are through die 320. Further reduction of the electromagnetic interference and the parasitic capacitance can be achieved as a result. Also, the structure occupies less area.

The bottom contact pads on die 320 can be bonded to contact pads on another integrated circuit or a wiring substrate. In this case, the die 320 serves as a semiconductor "interposer" positioned between die 310 and other integrated circuits or between die 310 and a wiring substrate.

Die 320 may include ground planes or grids or other grounded lines to shield the circuitry above and below the interposer from the clock distribution network.

In another embodiment, several interposers are provided, with different parts of a clock distribution network on different interposers.

In some embodiments, the clock distribution lines 150 (FIGS. 1, 2) are formed in trenches etched in a semiconductor substrate. The RC value of lines 150 can be lowered by making the trenches deeper, without increasing the lateral area occupied by the RC lines. Also, the RC value, and hence the clock skew, become more controllable.

Other conductive lines, not belonging to the clock distribution network, can be formed in such trenches.

Other embodiments and variations are described below. The invention is defined by the appended claims.

BRIEF DESCRIPTION OF THE DRAWINGS

FIGS. 15A–15D, 16, 17A–17D are cross sectional view of embodiments of the present invention in the process of fabrication.

DESCRIPTION OF SOME EMBODIMENTS

The examples in this section are provided for illustration and not to limit the invention. The invention is not limited to particular circuits, materials, processes, process parameters, equipment, or dimensions.

Figure 4:
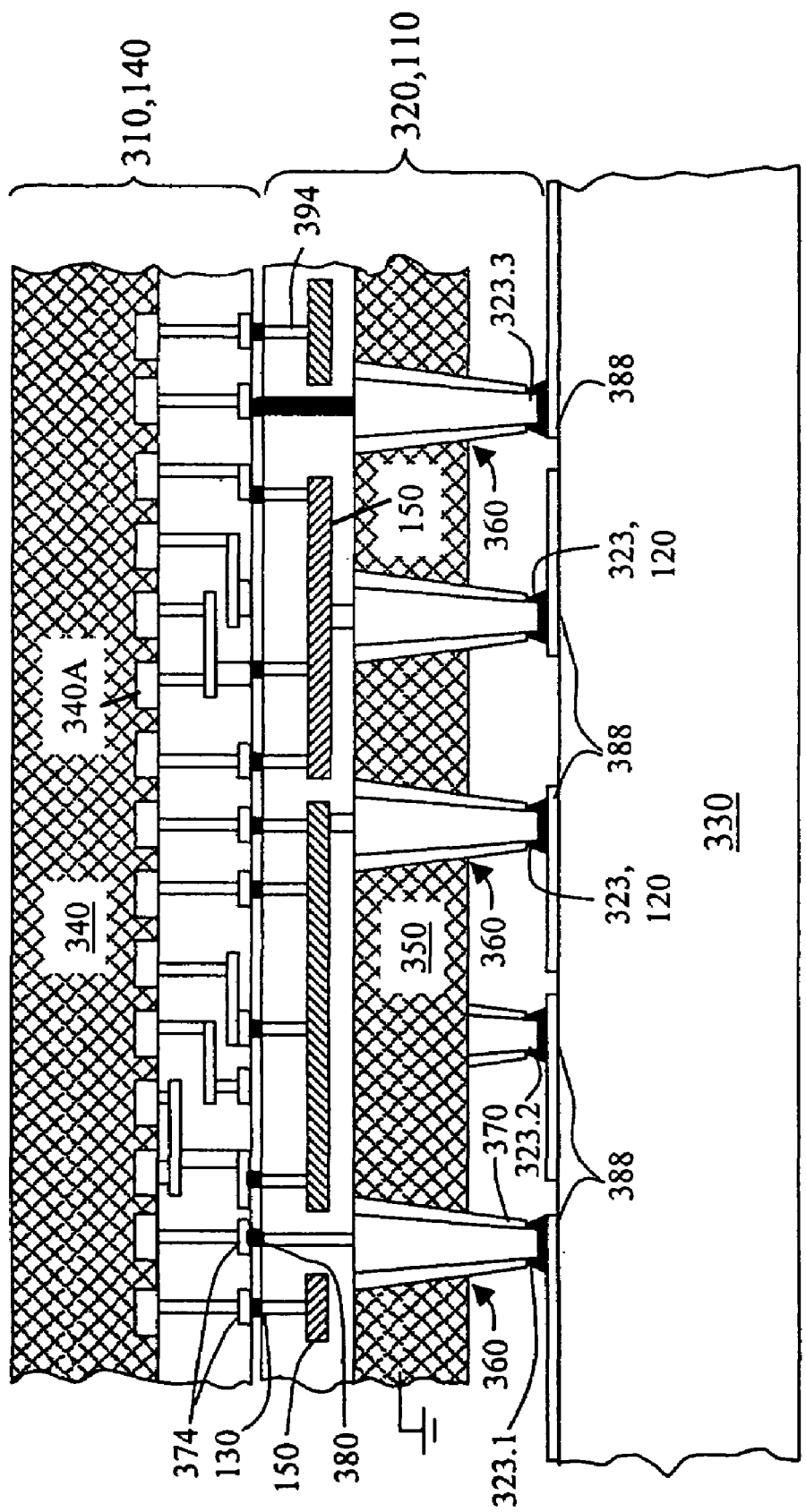
FIGS. 4 and 5 are cross sectional views of embodiments of the present invention.

FIG. 4 illustrates an integrated circuit 310 mounted on another integrated circuit 320 which in turn is mounted on a wiring substrate 330. Each of circuits 310, 320 is a semiconductor die or wafer, or some portion of a semiconductor wafer. Circuit 310 includes clocked circuitry 140 and may also include non-clocked circuitry. For example, circuit 310 may include a microprocessor, a memory, a digital controller, and so on. Circuit 320 is an interposer that contains clock distribution networks 110. The clock distribution networks can be of any type, including the types shown in FIGS. 1, 2, or other types, known or to be invented.

Circuit 310 includes a semiconductor substrate 340. Active areas 340A may have been formed in substrate 340 for transistors, resistors, capacitors, interconnect lines, or other circuit elements. Interposer 320 includes a semiconductor substrate 350. Conductive lines 150 have been formed from one or more metal layers deposited over substrate 350 and insulated from the substrate by insulating layers. An insulating layer may include one or more dielectric layers, a stack of dielectric and semiconductor layers, and other insulating structures, known or to be invented. Alternatively, lines 150 can be formed from diffused (doped) areas of substrate 350, or a combination of metal layers and diffused areas, or from other conductive materials, using any suitable techniques, known or to be invented. Some techniques for forming the lines 150 are described below with respect to FIGS. 8–11. Clock terminals 130 (the outputs of the clock distribution networks) are contact pads formed at the top surface of interposer 320. Clock input terminals 120 are provided by contact pads 323 located at the bottom surface of interposer 320. The clock terminals are inputs to clock distribution networks. Holes 360 pass through substrate 350 between its top and bottom surfaces. Conductive features are formed in through holes 360 to connect the clock input terminals 120, and possibly other terminals 323 at the bottom of interposer 320, to contact pads and/or circuitry at the top of the interposer. The conductive features are insulated from substrate 350 by dielectric 370. Suitable techniques for forming such conductive features are described in U.S. Pat. No. 6,322,903 issued Nov. 27, 2001 to O. Siniaguine et al. and incorporated herein by reference. Other techniques, known or to be invented, can be also used. The conductive features can be metal plugs or thin films deposited over sidewalls of holes 360 over dielectric 370. The conductive features can be perpendicular to the top and bottom surfaces of circuit 320 or substrate 340, or the conductive features can form large angles with these surfaces. These angles are at least 80° in some embodiments, or at least 45°, or at least 30°. Other angles are possible.

Figure 1:
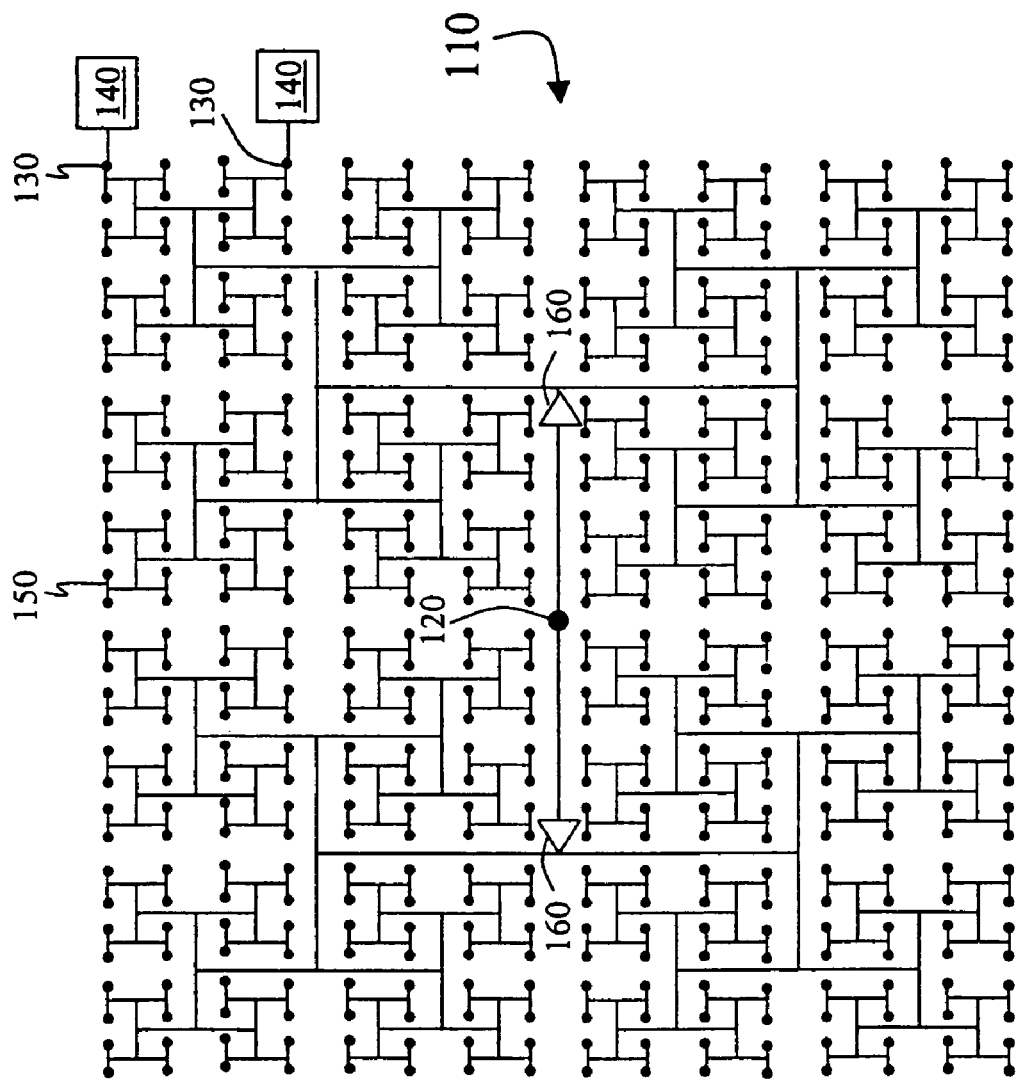
FIGS. 1 and 2 are plan views that illustrate prior art clock distribution networks.

Circuit 310 is bonded to interposer 320 in a flip chip manner, with the active areas 340A at the bottom of substrate 340. Contact pads 374 on the bottom of circuit 310 are bonded to contact pads on the top of circuit 320. Some of contact pads 374 are inputs of circuit blocks 140 (FIG. 1). These contact pads 374 are bonded to pads 130. Other contact pads 374 are bonded to other contact pads 380 at the top of interposer 320. Contact pads 380 can be connected, by conductive features in holes 360, to contact pads 323 (i.e. contact pads 323.1, 323.2, 323.3 etc.) on the bottom of interposer 320. In one example, contact pad 323.1 is a power supply input. Contact pad 323.3 is a ground input. Contact pad 323.2 an input, output, or input/output terminal for a signal. The invention is not limited to any particular signals that can be routed through interposer 320.

Contact pads 323 are bonded to pads 388 on wiring substrate 330.

The bonding of circuit 310 to interposer 320 can be accomplished with solder, thermocompression, conductive or anisotropic adhesive, or any other technique, known or to be invented. The same techniques, or other techniques, can be used to bond the contact pads 323 to pads 388.

Active areas 340A may be positioned at the top of circuit 310. Circuit 310 may include contact pads both at the top and at the bottom, with through holes going through substrate 340 to provide suitable interconnections. Other integrated circuits (not shown), including other interposers, can be bonded to contact pads on top of circuit 310. See the aforementioned U.S. Pat. No. 6,322,903. These other integrated circuits may contain parts of clock distribution networks. The integrated circuits may be bonded to each other in any configurations, not necessarily in a stack one above the other. For example, multiple circuits 310 can be bonded side by side to the top surface of interposer 320. Multiple interposers may be present, and they may contain different parts of clock distribution networks, or different clock distribution networks.

Figure 5:
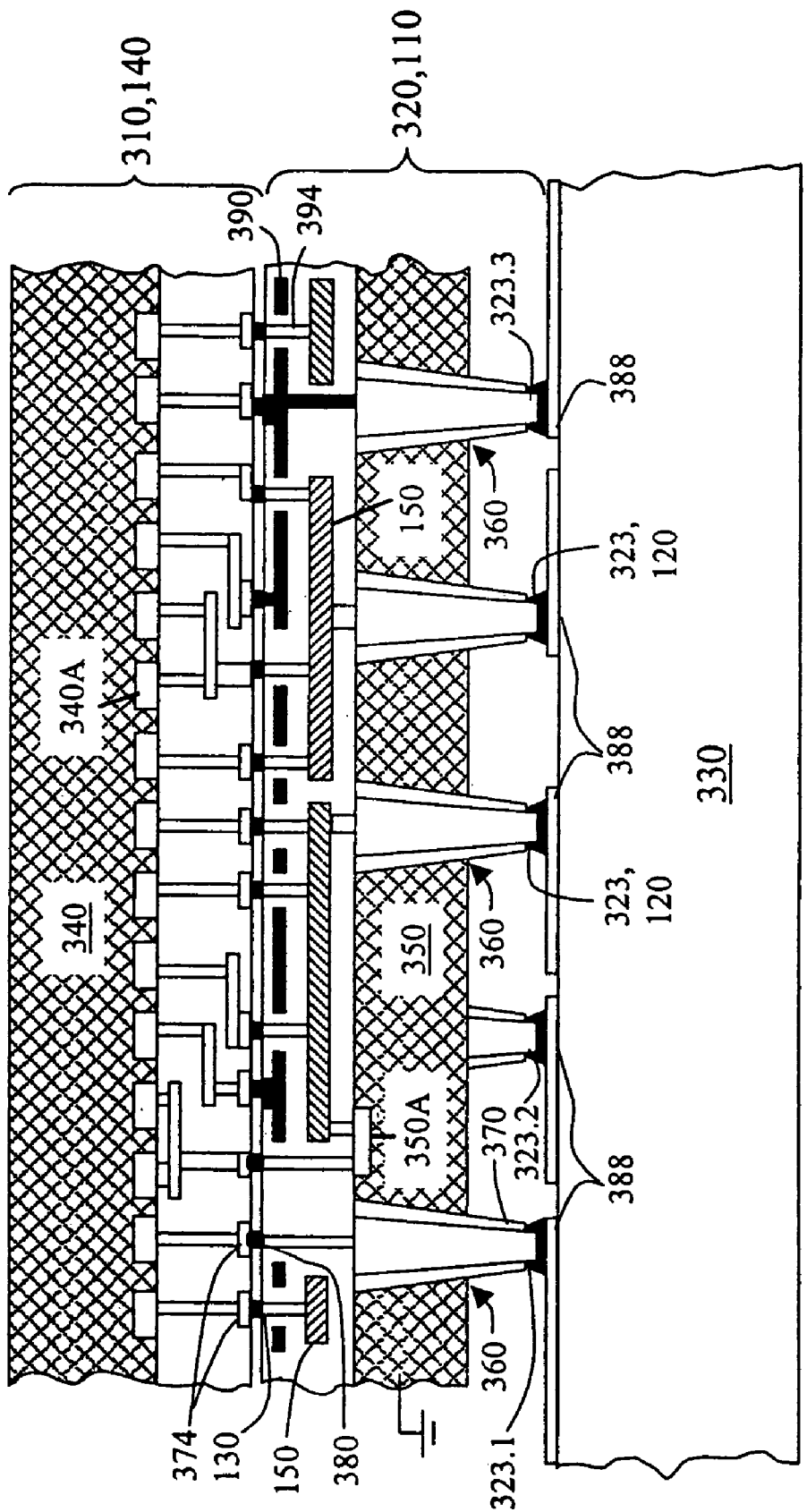

FIG. 5 shows a similar structure but with interposer 320 containing a ground structure 390. Structure 390 can be a ground plane, i.e. a conductive feature that is wider than a line 150. Structure 390 can be a ground grid (a grid of grounded conductive lines) or may consist of just a few (possibly one) grounded lines. Structure 390 may include multiple ground planes or grids. Structure 390 shields the circuit 310 from noise generated by the clock distribution networks. Structure 390 can be formed from a metal layer or layers overlying the lines 150. Structure 390 is connected to contact pad 323.3 and is insulated from lines 150 by dielectric. Structure 390 is interrupted to make room for contacts 394 that connect contact pads 130, 380 at the top of interposer 320 to lines 150 and other features in the interposer. Ground structure 390 may extend over almost all of substrate 350, or at least almost all of the clock distribution networks.

In some embodiments, structure 390 is held at a constant non-ground voltage.

Due to the presence of shielding structure 390, it is less important to have a ground plane in circuit 310. The number of metal layers in circuit 310 can therefore be reduced. The incremental cost of each additional metal layer increases with the total number of metal layers in an integrated circuit, so moving a ground plane from circuit 310 to circuit 320 may reduce the total manufacturing cost.

Figure 2:
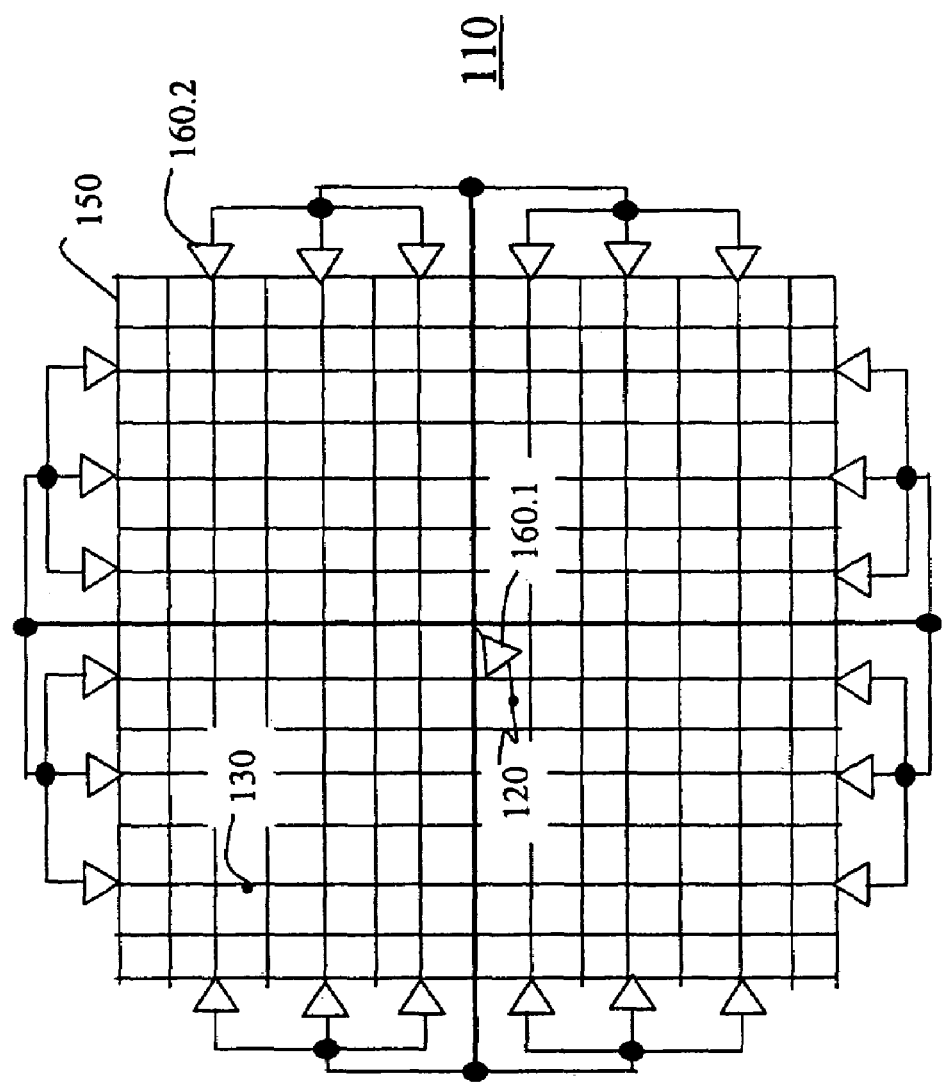
Figure 3:
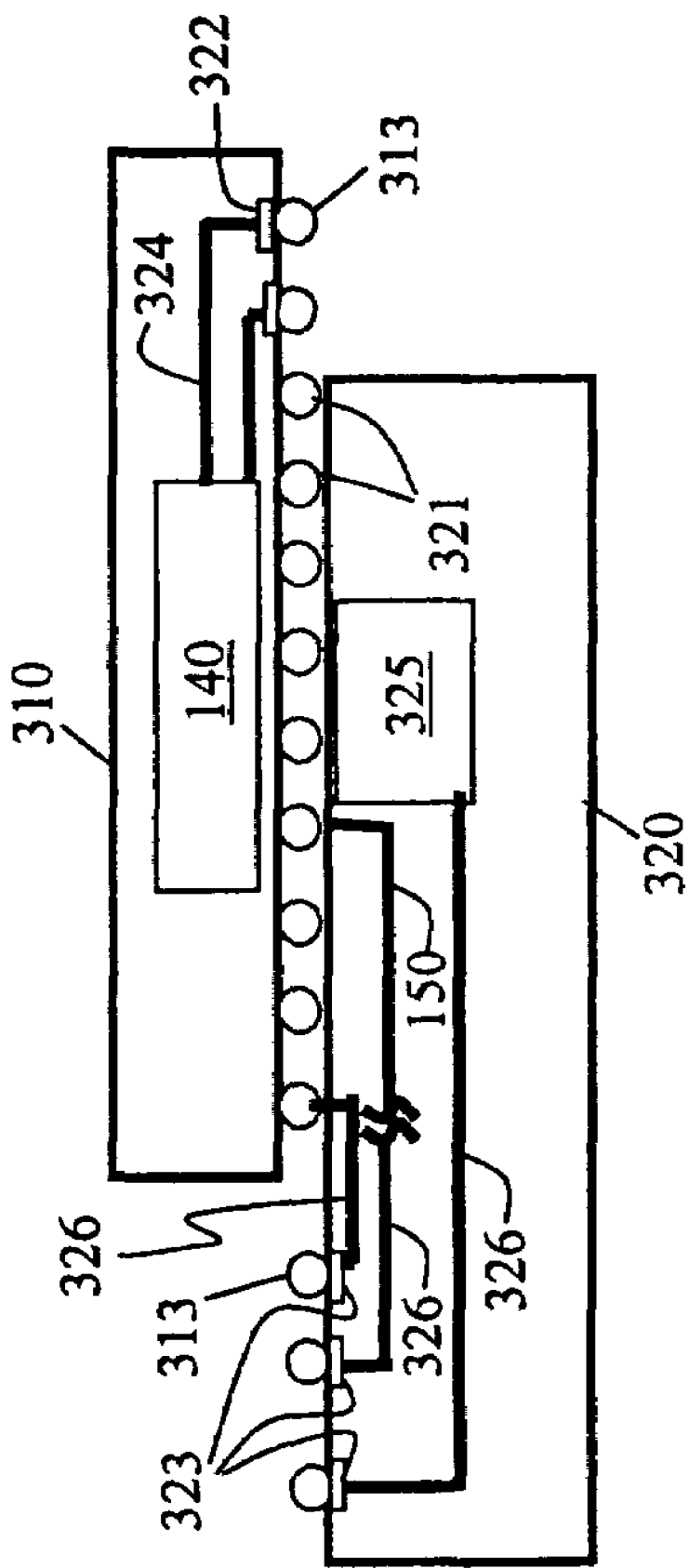
FIG. 3 is a side view illustrating a prior art structure.

As shown in FIG. 5, active areas 350A may be formed in substrate 350 for transistors or other elements of "clock headers" 160 (such as shown in FIGS. 1, 2). Clock headers 160 can be amplifiers, clock dividers or multipliers, phase shifters, or other clock circuitry. In the example of FIG. 5, active areas 350A are located at the top surface of substrate 350, but this is not necessary. Similar active areas and clock headers can be formed in the structure of FIG. 4.

Placing the ground structure 390 on the interposer rather than on circuit 310 reduces the capacitive coupling between the ground structure and circuit elements of circuit 310 because the ground structure becomes father from the circuit elements of circuit 310. The capacitive coupling and electromagnetic interference between the ground structure and the conductive features in holes 360 is small because the ground structure and the conductive features in holes 360 are at an angle (near 90°) to each other.

If a ground structure is provided in circuit 310, the capacitive coupling and the electromagnetic interference between this ground structure and the conductive features in holes 360 are reduced for the same reason.

In some embodiments, at least some contact pads 380 are positioned above the respective holes 360 and are connected to respective contact pads 323 without use of horizontal conductive lines. A contact pad 380 can however be laterally spaced from the respective hole 360, and connected to the respective contact pad 323 by a combination of a conductive feature in the hole 360 and horizontal lines.

Substrate 350 is grounded, or held at some other constant voltage, to shield the clock distribution networks from the circuitry in wiring substrate 330 and vice versa. Of course, the active areas 350A do not have to be grounded, but the grounded portion of substrate 350 extends laterally throughout the substrate in some embodiments.

Figure 6:
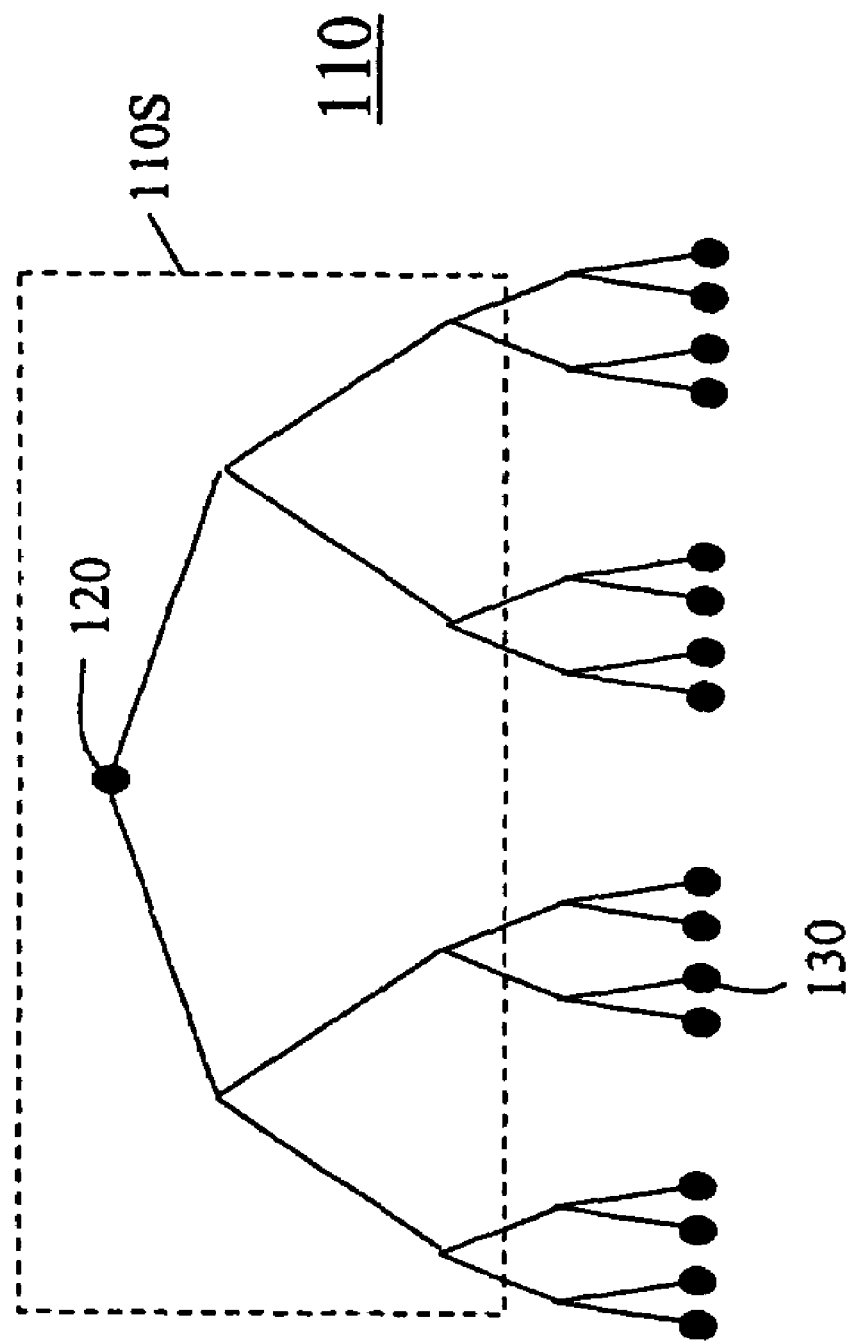
FIG. 6 is a schematic diagram illustrating an embodiment of the present invention.

Interposer 320 may contain only a part of a clock distribution network. For example, interposer 320 may contain only a sub-tree 110S (FIG. 6) of a tree network 110. Sub-tree 110S consists of a number of tree levels including the root 120. The rest of network 110 may be in circuit 310.

Figure 7:
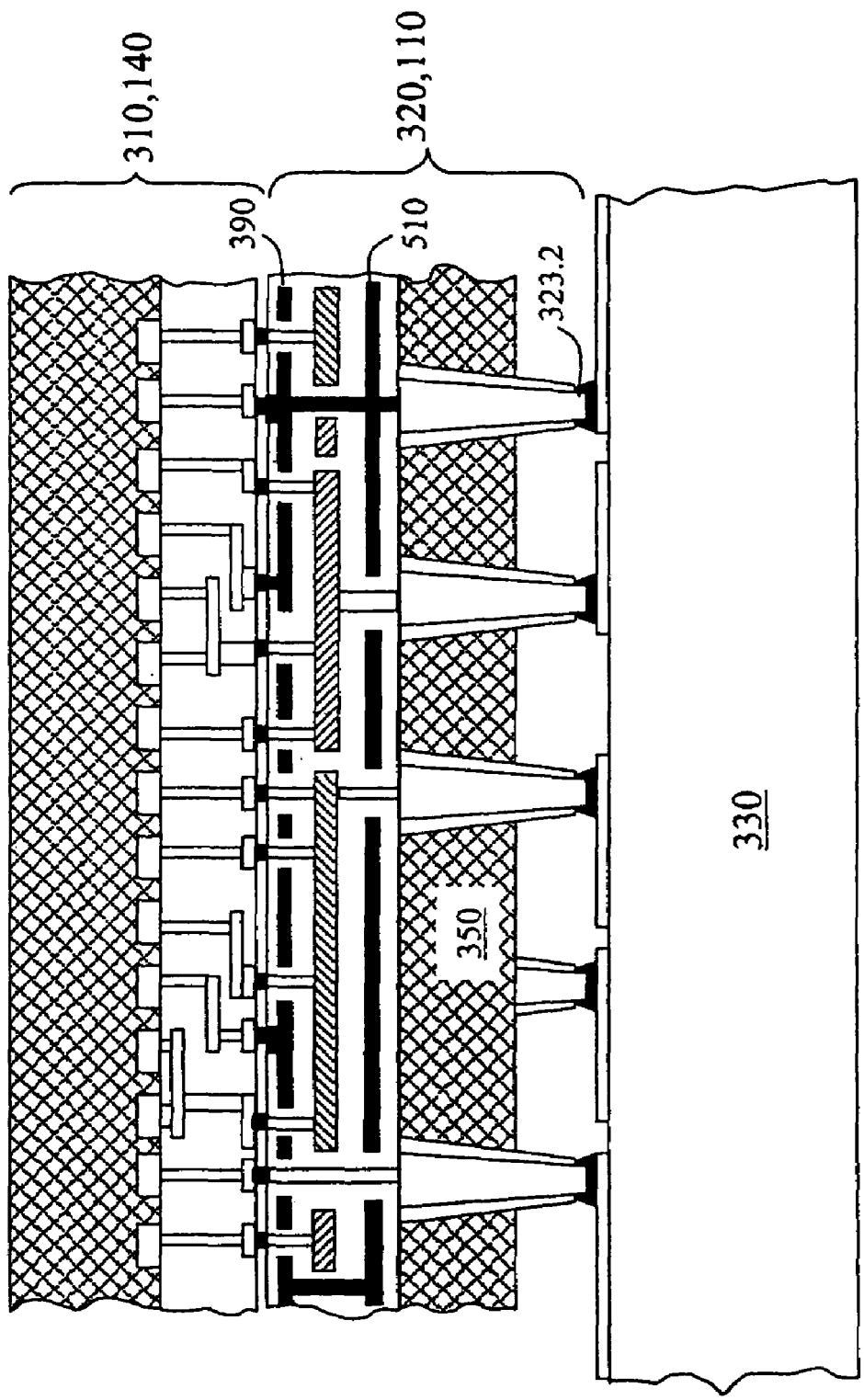
FIGS. 7 and 8 are cross sectional views of some embodiments of the present invention.

In FIG. 7, interposer 320 contains an additional ground structure 510. This may be a ground plane or grid or any other type similar to structure 390. Ground structure 510 is located between clock distribution lines 150 and substrate 350. In some embodiments, structure 510 is held at a constant non-ground voltage. Substrate 350 is not necessarily held at a constant voltage.

In some embodiments, interposer 320 contains only the clock distribution network or networks, so its fabrication is relatively inexpensive. In other embodiments, interposer 320 also contains decoupling capacitors, diodes, resistors, transistors, and other elements. In some embodiments, the fabrication yield of the entire structure is increased because the fabrication of the clock distribution network does not have to be integrated with the fabrication of circuit 310 except at the packaging stage.

Figure 8:
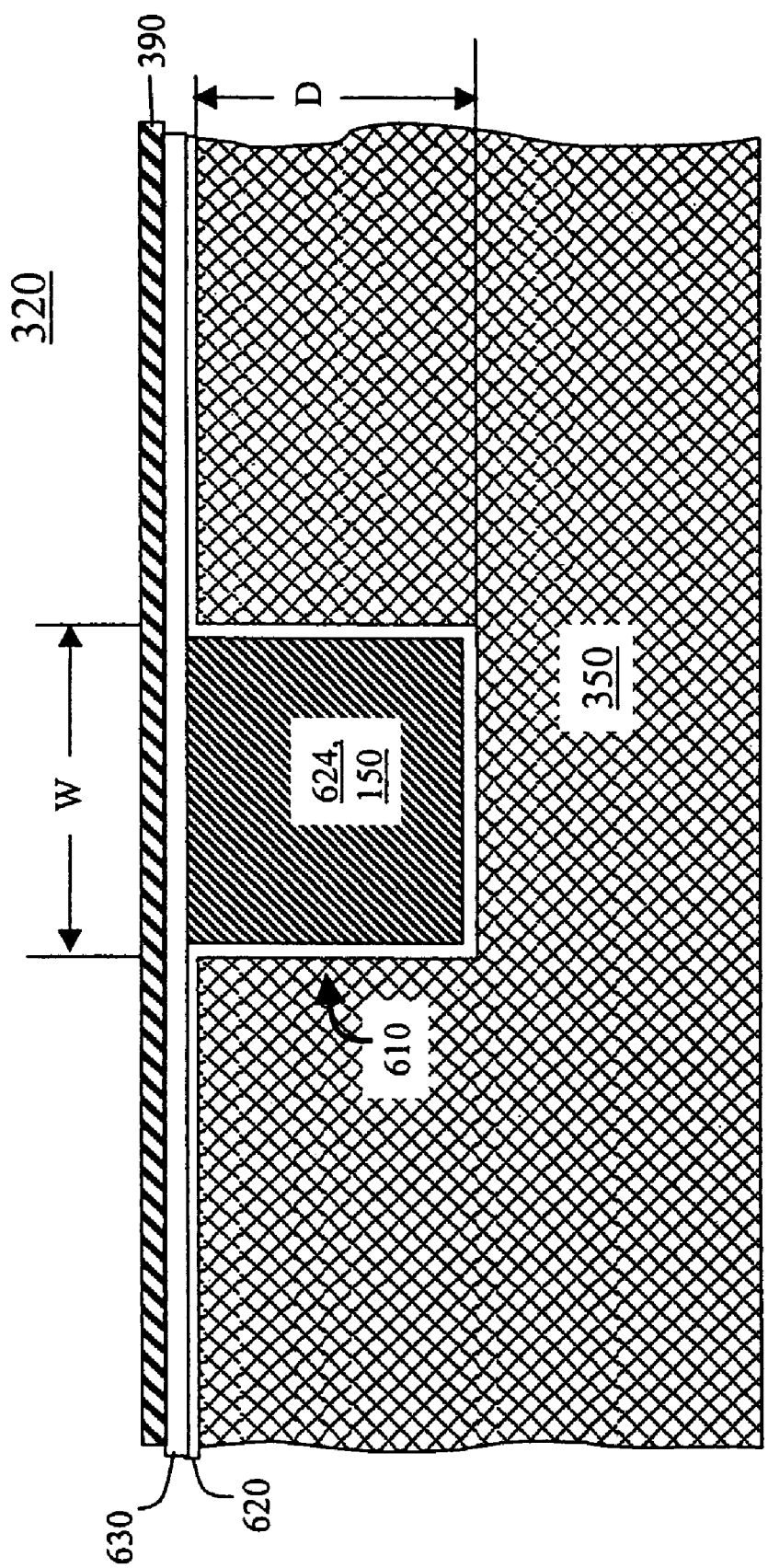

FIG. 8 is a cross sectional view illustrating fabrication of lines 150 in one embodiment. Trenches 610 are etched in substrate 350. Dielectric film 620 is formed on the substrate. Dielectric 620 covers the trench surfaces. Then a metal layer 624, e.g. tungsten, aluminum or copper, is deposited to fill the trenches and possibly cover the substrate. If metal 624 covers the substrate, the metal is removed from above the substrate by chemical mechanical polishing (CMP), electrochemical polishing, etching, or some other method. The trenches remain filled with metal 624, which provides the lines 150. The trenches may form a tree or grid network as in FIG. 1 or 2, or some other network. Metal 624 provides a corresponding conductive network.

In some embodiments, metal 624 fills the trenches only partially. Metal 624 can be a thin film on the trench surfaces. Also, metal 624 can be replaced with multiple metal layers separated by dielectric. Different metal layers may provide different lines 150 in the same trench. Alternatively, different metal layers may be interconnected to provide a single line 150. Use of multiple metal layers instead of a single layer filling the trench reduces thermomechanical stress. Two of the metal layers in a trench can be used for the opposite phases of a differential clock signal. Alternatively, the opposite phases can be implemented by metal lines formed in adjacent trenches running in parallel.

In one embodiment, substrate 350 is monocrystalline silicon. Trenches 610 have a width W of about 0.1 µm to 10 µm and a depth D of 1 to 20 µm. The length of the trenches is determined by lines 150. Dielectric 620 is silicon dioxide, silicon nitride, or some other dielectric, possible having a low dielectric constant. Dielectric 620 can also contain air gaps. See U.S. Pat. No. 6,265,321 issued Jul. 24, 2001, entitled "AIR BRIDGE PROCESS FOR FORMING AIR GAPS", incorporated herein by reference. An exemplary thickness of dielectric 620 is 0.1–5 µm. Dielectric 620 can be formed by thermal oxidation, chemical vapor deposition (CVD), or other techniques, known or to be invented. Dimensions other than those mentioned above are also possible. The width W and the other dimensions may vary from one line 150 to another in the same interposer.

Forming the lines 150 in the trenches can make the RC value of lines 150 more controllable. Consider the example of FIG. 8, with metal 624 filling the trenches. The capacitance associated with lines 150 has the following components: (i) the capacitance $C_{sub}$ between lines 150 and substrate 350, and (ii) the capacitance $C_{cir}$ between lines 150 and other circuit elements, e.g. elements of amplifiers 160. Due to the lines 150 being formed in the trenches, the substrate component $C_{sub}$ becomes a greater portion of the total capacitance. The substrate component $C_{sub}$ is easy to control—if the areas of substrate 350 adjacent to lines 150 are held at a constant voltage, the substrate component $C_{sub}$ is largely a function of the trench dimensions, independent of the placement of the other circuit elements. Therefore, the clock propagation time becomes more controllable.

In addition, the RC value can be reduced by increasing the trench depth D without increasing the lateral area occupied by the clock distribution network. When D is increased by some factor K, the resistance R of lines 150 is reduced by the same factor K. The capacitance component associated with the sidewalls of lines 150 increases by the same factor K, but the capacitance associated with the top and bottom surfaces of lines 150 does not change. Therefore, the total capacitance increase does not offset the reduced resistance.

In many integrated circuits fabricated with conventional techniques, clock distribution lines 150 cannot be formed in trenches in a semiconductor substrate because large portions of the substrate are taken by active areas. Moving the clock distribution networks, or parts of the clock distribution networks, to the interposer facilitates fabrication of lines 150 in the trenches.

In some embodiments, interposer 320 is absent. A part or all of clock distribution lines 150 is formed in trenches in substrate 340.

In FIG. 8, dielectric 630 is formed over metal 150. Ground structure 390 is formed from a metal layer on dielectric 630.

Figure 9:
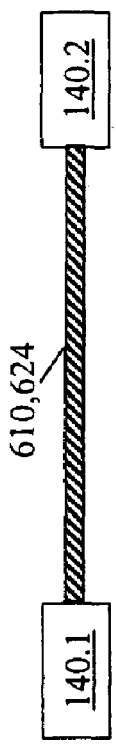
FIG. 9 is a top view of an embodiment of the present invention.

Other conductive lines, not necessarily parts of clock distribution networks, can be formed in trenches in the substrate. In FIG. 9 (top view), conductive line 624 in trench 610 interconnects two laterally spaced nodes of circuit blocks 140.1, 140.2. Blocks 140.1, 140.2 can be any circuits, clocked or non-clocked. The structure of FIG. 9 may be part of circuit 310 or 320.

Figure 10:
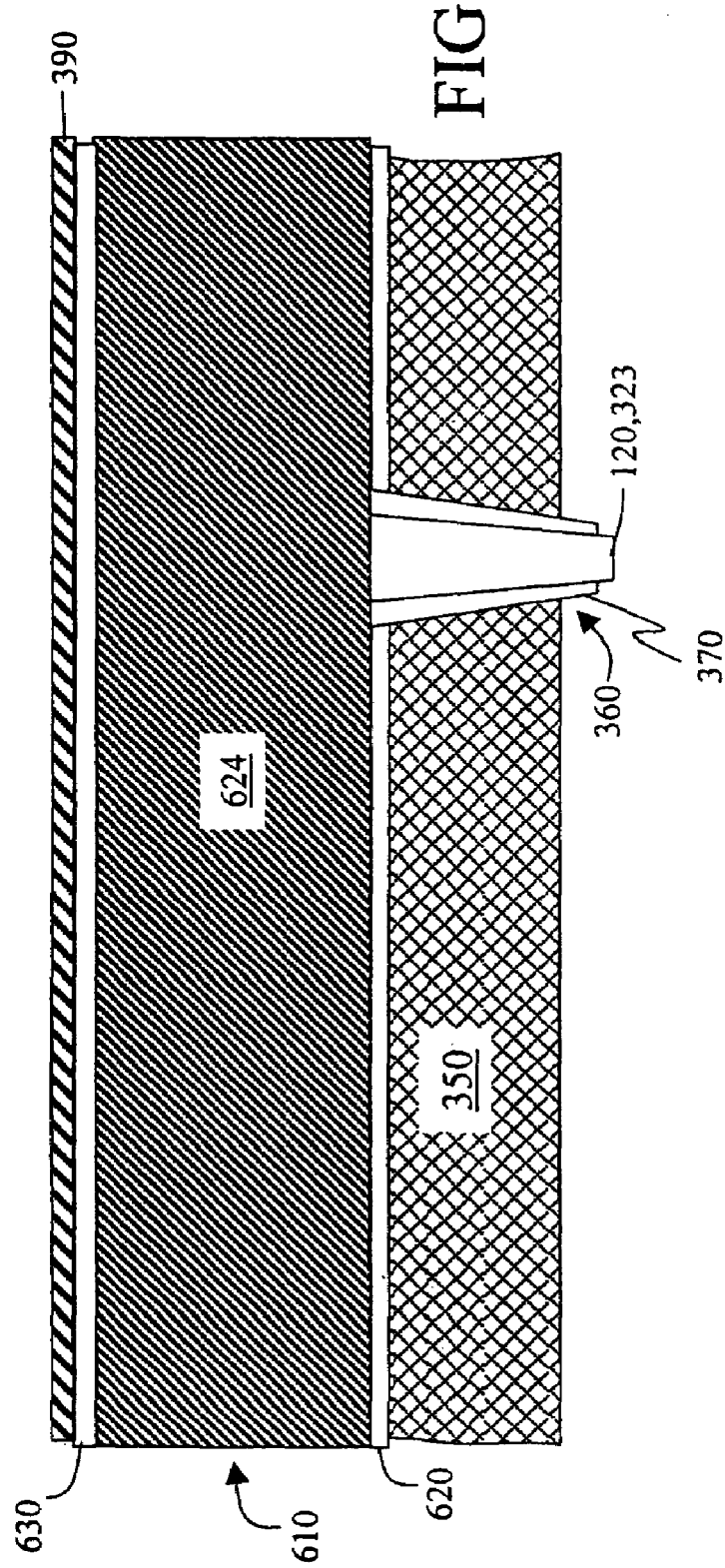
FIGS. 10–11 are cross sectional views of some embodiments of the present invention.

As shown in FIG. 10, a metal line 624 in a trench 610 in substrate 350 can be connected to a contact pad 323 on the bottom of semiconductor substrate 350 by a conductive feature in a hole 360 passing through the substrate at the bottom of the trench.

Figure 11:
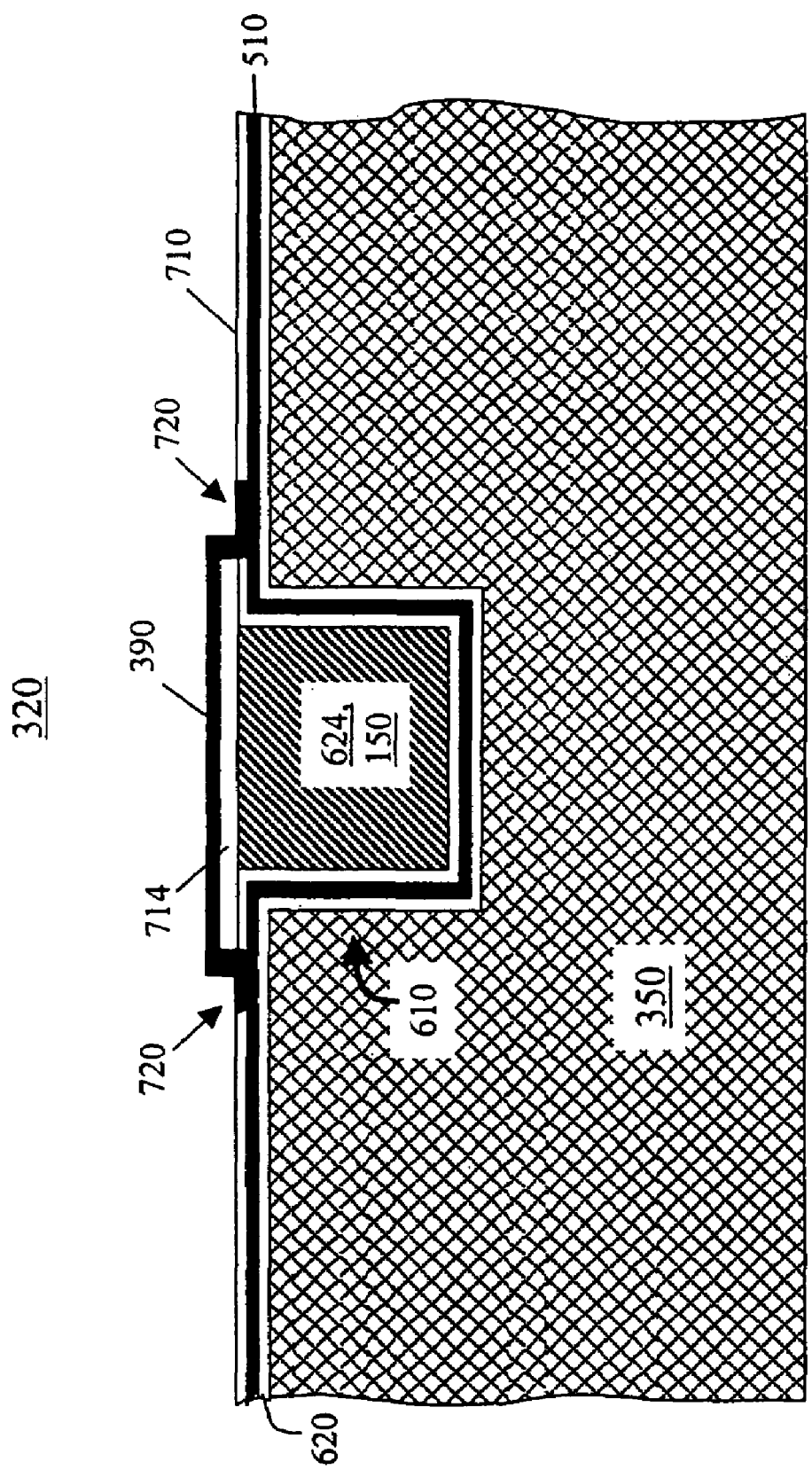

FIG. 11 shows an interposer 320 with two ground structures 390, 510 (as in FIG. 7). Trenches 610 and dielectric 620 are formed as in FIG. 8. Then a metal layer 510 is deposited to provide a ground structure underneath the lines 150. Metal 510 covers the entire surface of substrate 350, including the surfaces of the trenches. In one embodiment, the trenches are 1 μm wide and 1 to 20 μm deep, and metal 510 is aluminum copper, tantalum, titanium, or some other metal 0.01 μm to 2 μm thick. Metal 510 can be patterned as desired to make room for clock headers 160 and other circuitry, and/or provide circuit elements that are not necessarily part of a ground structure. Then dielectric 710 is deposited. For example, silicon dioxide, silicon nitride, a low-k (low dielectric constant) dielectric, or a stack of different dielectric and semiconductor materials can be formed to a thickness of 0.01–2 μm by CVD. Dielectric 710 can be patterned as desired. Then metal 624 is deposited as described above in connection with FIG. 8. Metal 624 provides the lines 150. Metal 624 is insulated from metal 510 by dielectric 710. Then dielectric 714 is deposited and patterned as desired. Dielectric 714 covers the metal lines 150. Contact openings 720 are etched in dielectric 710 and, possibly, dielectric 714, to expose metal 510 outside of trenches 610. Then metal 390, e.g. cobalt, aluminum, copper, or some other material, is deposited over the structure and patterned as desired. Metal 390 overlies the lines 150 and contacts the metal 510 in openings 720. In some embodiments, metal 390 extends over the entire length of lines 150. Metal layers 390, 510 provide ground structures above and below the lines 150.

Figure 12:
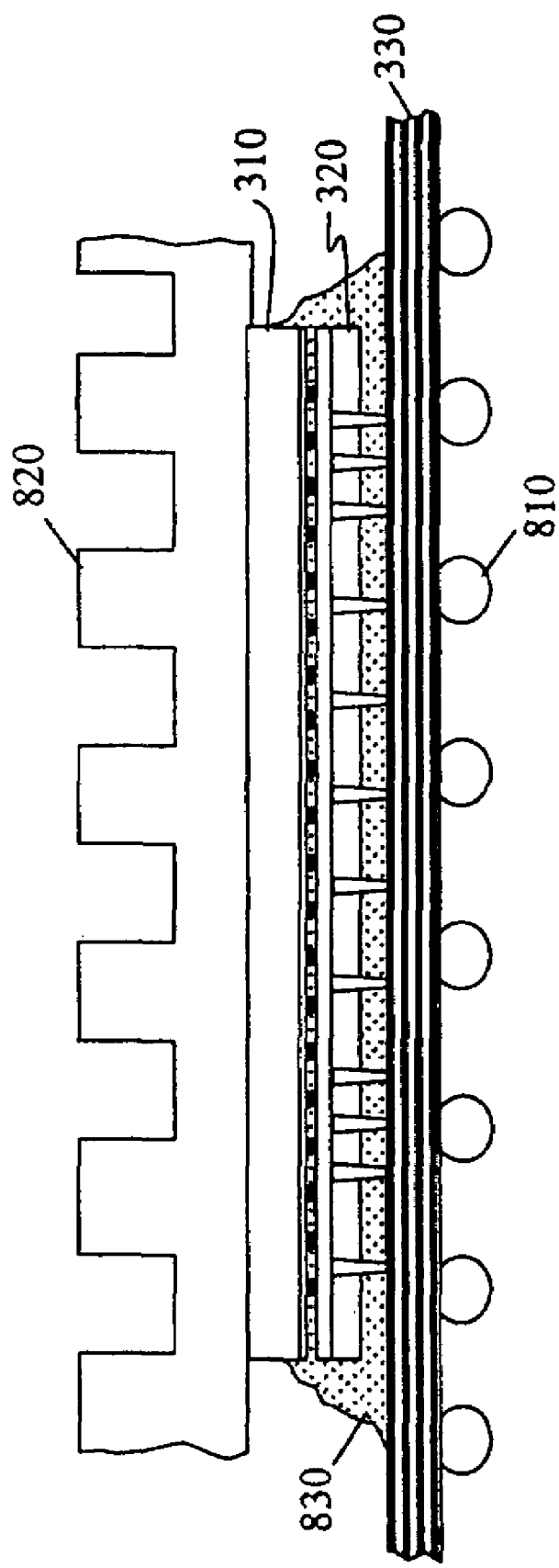
FIG. 12 is a side view of one embodiment of the present invention.

FIG. 12 illustrates exemplary packaging. This is a conventional ball grid array (BGA) package. Wiring substrate 330 is a BGA substrate (e.g. plastic) with solder balls 810 on the bottom. Heat sink 820 is placed on circuit 310. Underfill 830 fills the area between the circuits 310, 320 and the area between interposer 320 and substrate 330. Other packaging techniques, known or to be invented, can also be used.

Additional integrated circuits (e.g. memory, logic, RF circuits) or passive components (e.g. decoupling capacitors, filters) can be bonded to the bottom of interposer 320 between the interposer and the wiring substrate.

Figure 13:
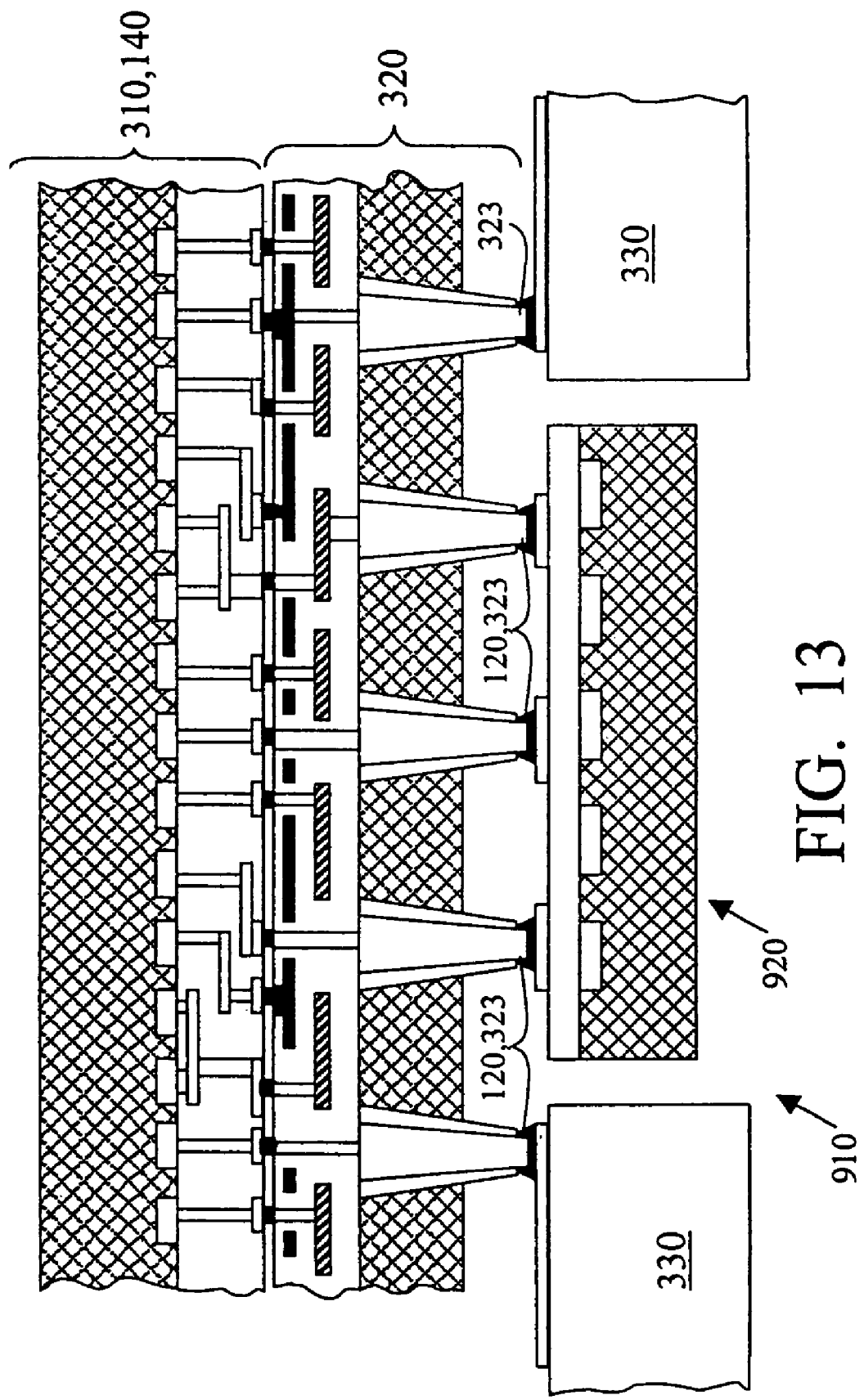
FIG. 13 is a cross sectional view of one embodiment of the present invention.

In FIG. 13, wiring substrate 330 has a cavity or through hole 910. Integrated circuit 920 is bonded to the bottom of interposer 320 and is located in the cavity or through hole 910. Contact pads 120, 323 on the bottom of interposer 320 are bonded to contact pads at the top of circuit 920 and wiring substrate 330.

Some or all of the clock distribution circuitry may be located in circuit 920.

Figure 14A:
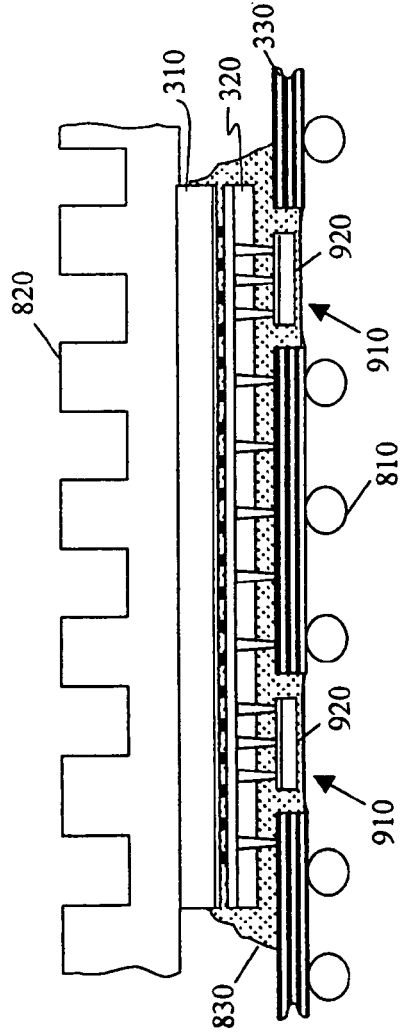
FIG. 14A is a side view of one embodiment of the present invention.
Figure 14B:
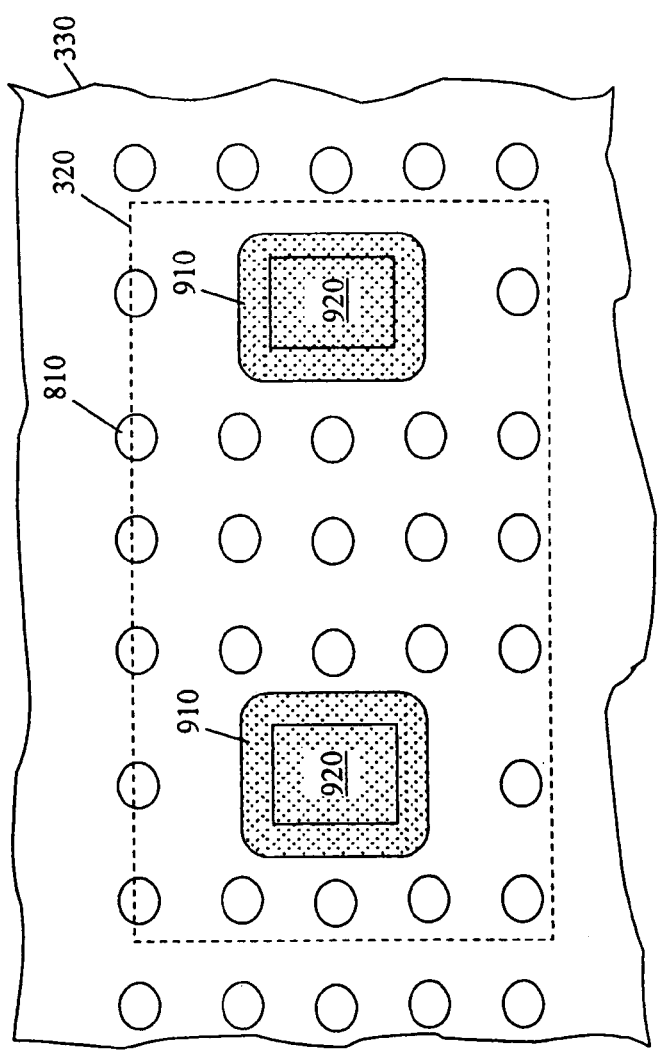
FIG. 14B is a bottom view of the structure of FIG. 14A.

FIGS. 14A, 14B are side and bottom views, respectively, of a packaged BGA structure. This structure combines the features of the structures of FIGS. 12 and 13. Wiring substrate 330 has two through holes 910. An integrated circuit 920 is positioned in each of the through holes and bonded to interposer 320, as in FIG. 13.

Figure 15A:
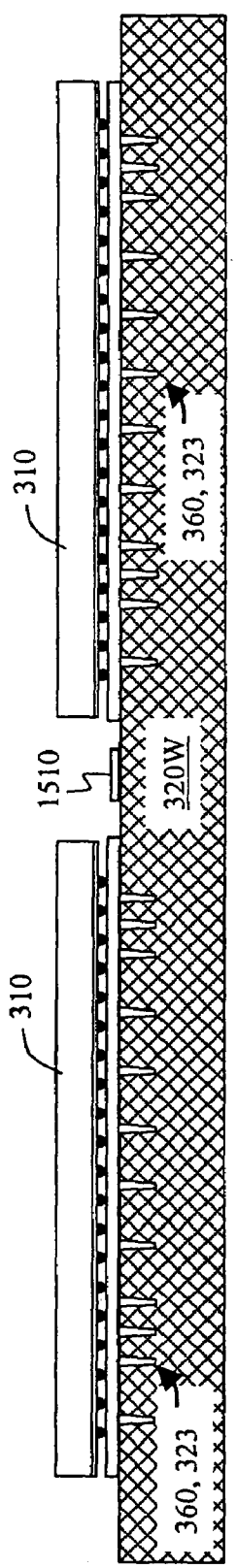
Figure 15B:
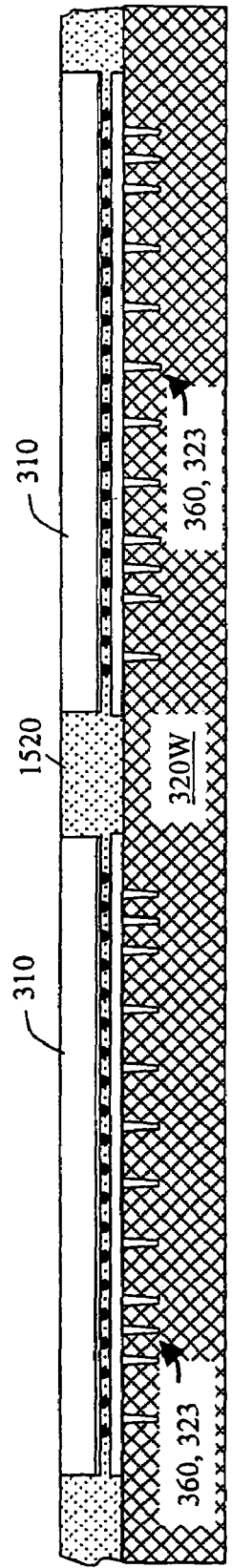

FIGS. 15A–15D illustrate an exemplary manufacturing process. Multiple integrated circuits 310 are flip-chip bonded to wafer 320W, as shown in FIG. 15A. Wafer 320W will be diced into interposers 320. Wafer 320W has been processed to form openings 360 and contacts 323, but the openings are not yet through holes, and the contacts 323 are not exposed. Contact pads 1510 (shown only in FIG. 15A for simplicity) on top of wafer 320W between circuits 310 are used to test the circuitry after the flip-chip bonding.

The areas between the adjacent circuits 310, and the areas between the circuits 310 and the interposer wafer 320W, are filled with a flowable material 1520 (FIG. 15B), such as commonly used for underfill. Suitable materials include polymers, epoxies, BCB (Benzocyclobutene). Fill material 1520 is cured by known techniques. Layer 1520 is shown flush with the top surface of circuits 310, but this is not necessary. The top surface of layer 1520 may be below the top surface of circuits 310, or the layer 1520 may cover the circuits 310.

Figure 15C:
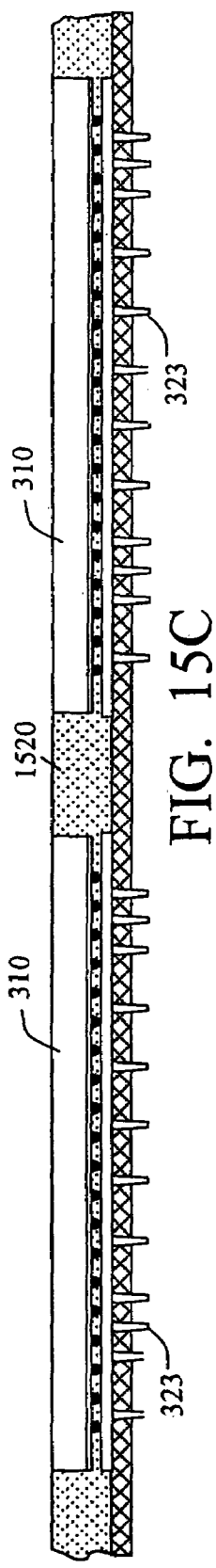
Figure 15D:
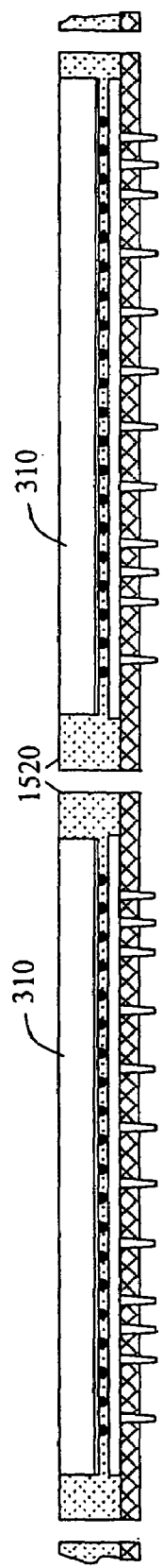

Interposer wafer 320W is thinned on the bottom to expose the contacts 323 (FIG. 15C). An exemplary thickness of the thinned wafer 320W is 10–200 μm, and other dimensions are possible. Exemplary thinning processes are described in U.S. Pat. No. 6,322,903 issued Nov. 27, 2001 to Siniaguine et al., incorporated herein by reference. Circuits 310 and fill 1520 increase the rigidity of the structure and prevent bowing, warping, or other deformation of wafer 320W. Consequently, damage to the wafer becomes less likely.

Wafer 320W is diced into individual interposers 320 (FIG. 15D) along scribe lines located between the circuits 310. The dicing can involve any suitable techniques (e.g. sawing, scribing, laser, water jet cut, or other techniques, known or to be invented).

Each interposer 320 may have the same lateral dimensions as the corresponding circuit 310.

In FIG. 16, circuit 310 is smaller than the interposer.

The process of FIGS. 17A–17D are similar to the process of FIGS. 15A–15D, and each of FIGS. 17A–17D shows the same stage as the respective FIG. 15A–15D. As shown in FIG. 17A, before the fill material 1520 is deposited, grooves 1710 are formed in wafer 320W along the scribe lines. The grooves may be formed by etching, sawing, or any other suitable technique. The grooves are at least as deep as the final thickness of interposers 320 after the interposer thinning (FIG. 17C). The groove width is greater than the width of the cut made at the dicing stage of FIG. 17D. Fill material 1520 may or may not fill the grooves at the stage of FIG. 17B. During the thinning of wafer 320W, the grooves become exposed on the bottom (FIG. 17C), but the fill 1520 holds the interposers 320 together until the dicing stage of FIG. 17D. Because the interposers 320 are held together, handling of the structure after the thinning step is simplified. At the dicing stage, the edges of the interposers 320 are less likely to be damaged by the dicing tool. Also, if the wafer 320W is thinned by a wet or dry etch, and if the fill material does not reach to the bottom of grooves 1710 or the fill material is etched faster than the wafer 320W, then the bottom corners and edges of interposers 320 will be rounded and less prone to chipping. Further, the rounded corners and edges will not accumulate as much stress during subsequent packaging and during thermal cycling when the circuitry is in operation. See U.S. patent application Ser. No. 09/752,802 filed Dec. 28, 2000 by Siniaguine et al., published as no. 2001/0001215, incorporated herein by reference.

The invention is not limited to the particular processes, dimensions, or materials described above. Metal can be replaced with other conductive materials. Contact pads 323 can be connected to other circuitry with discrete wires. Other embodiments and variations are within the scope of the invention, as defined by the appended claims.

The invention claimed is:

1. An apparatus comprising a first semiconductor integrated circuit comprising:
   a first surface and a second surface that are opposite to each other; and
   a clock distribution network having an input terminal which is a contact pad at the second surface and having a plurality of output terminals which are contact pads at the first surface;
   wherein the first semiconductor integrated circuit comprises a first semiconductor substrate which comprises a through hole, and the clock distribution network comprises a conductive feature going through the through hole;
   wherein the first semiconductor substrate further comprises one or more additional through holes; and
   the first semiconductor integrated circuit further comprises:
   one or more additional contact pads at the second surface at each of the additional through holes;
   an additional conductive feature in each of the additional through holes, the conductive feature providing at least a portion of a path for a signal and/or a power voltage and/or a ground voltage between the corresponding additional contact pad and a circuit element at the first surface.

2. The apparatus of claim 1 wherein for at least one conductive feature, the corresponding circuit element at the first surface is a contact pad.

3. The apparatus of claim 2 wherein for said at least one conductive feature, the corresponding circuit element at the first surface is located above the respective through hole, and the entire conductive path connecting the circuit element at the first surface to the respective additional contact pad at the second surface forms an angle of at least 30° with at least one of the first and second surfaces or with at least one of the semiconductor substrate's surfaces adjacent to the first and second surfaces.

4. The apparatus of claim 1 wherein the clock distribution network comprises a plurality of conductive lines, and the conductive features in all of said through holes form angles of at least 30° with at least one of the first and second surfaces or with at least one of the semiconductor substrate's surfaces adjacent to the first and second surfaces.

5. An apparatus comprising a first semiconductor integrated circuit comprising:
   a first surface and a second surface that are opposite to each other, and
   a clock distribution network having an input terminal which is a contact pad at the second surface and having a plurality of output terminals which are contact pads at the first surface;
   wherein the first integrated circuit comprises:
   a first semiconductor substrate; and
   a conductive structure to be held at a constant voltage, wherein at least a portion of the clock distribution network is located between the conductive structure and the first semiconductor substrate.

6. The apparatus of claim 5 wherein the conductive structure comprises a conductive plane or a conductive grid.

7. An apparatus comprising a first semiconductor integrated circuit comprising:
   a first surface and a second surface that are opposite to each other; and
   a clock distribution network having an input terminal which is a contact pad at the second surface and having a plurality of output terminals which are contact pads at the first surface;
   wherein the first integrated circuit comprises:
   a first semiconductor substrate; and
   a conductive structure to be held at a constant voltage, wherein at least a portion of the clock distribution network is separated from the first semiconductor substrate by the conductive structure.

8. The apparatus of claim 7 wherein the conductive structure comprises a conductive plane or a conductive grid.

9. An apparatus comprising a first semiconductor integrated circuit comprising:
   a first surface and a second surface that are opposite to each other; and
   a clock distribution network having an input terminal which is a contact pad at the second surface and having a plurality of output terminals which are contact pads at the first surface;
   a second semiconductor integrated circuit comprising a plurality of contact pads positioned at a first surface of the second semiconductor integrated circuit and bonded to the contact pads that are the output terminals of the clock distribution network.

10. The apparatus of claim 9 wherein the first integrated circuit comprises a first conductive structure between at least a portion of the clock distribution network and the second integrated circuit, and the first conductive structure is held at a constant voltage during operation of the apparatus.

11. The apparatus of claim 10 wherein the first conductive structure comprises a conductive plane or a conductive grid.

12. The apparatus of claim 10 further comprising a third circuit which is a wiring substrate and/or a semiconductor integrated circuit, wherein the third circuit comprises one or more contact pads bonded to one or more contact pads of the first integrated circuit which are located at the second surface of the first integrated circuit;

wherein the first integrated circuit comprises a second conductive structure to be held at a constant voltage, wherein the second conductive structure is located between at least a portion of the clock distribution network and the third circuit.

13. The apparatus of claim 10 wherein the second conductive structure comprises a conductive plane or a conductive grid.

14. The apparatus of claim 9 wherein the clock distribution network is a part of a larger clock distribution network, and the larger clock distribution network has another part located in the second integrated circuit.

15. An apparatus comprising a first semiconductor integrated circuit comprising:
   a first surface and a second surface that are opposite to each other; and
   a clock distribution network having an input terminal which is a contact pad at the second surface and having a plurality of output terminals which are contact pads at the first surface;
   wherein the first integrated circuit comprises a first semiconductor substrate which has a trench therein, and the clock distribution network comprises a conductive line formed in the trench and interconnecting two nodes of the clock distribution network;
   wherein the first integrated circuit further comprises:
   a first conductive layer located between the conductive line and a surface of the trench, wherein the first conductive layer is held at a constant voltage during operation of the apparatus;
   a first dielectric insulating the first conductive layer from the conductive line; and
   a second dielectric insulating the first conductive layer from the first substrate.

16. The apparatus of claim 15 wherein the first integrated circuit further comprises:
   a third dielectric overlying the conductive line; and
   a second conductive layer overlying the conductive line and insulated from the conductive line by the third dielectric, wherein the second conductive layer physically contacts the first conductive layer so as to be at the same voltage as the first conductive layer.

17. The apparatus of claim 16 wherein the second conductive layer extends over the entire conductive line.

* * * * *